(12) United States Patent
Frisina et al.

(10) Patent No.: US 6,228,719 B1
(45) Date of Patent: May 8, 2001

(54) MOS TECHNOLOGY POWER DEVICE WITH LOW OUTPUT RESISTANCE AND LOW CAPACITANCE, AND RELATED MANUFACTURING PROCESS

(75) Inventors: Ferruccio Frisina, Sant'agata Li Battiati; Giuseppe Ferla, Catania; Salvatore Rinaudo, S. Marco D'Alunzio, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/235,067

(22) Filed: Jan. 21, 1999

Related U.S. Application Data

(63) Continuation-in-part of application No. 08/740,713, filed on Nov. 4, 1996, now Pat. No. 5,900,662.

(30) Foreign Application Priority Data

Nov. 6, 1995 (EP) ................... 95830468

(51) Int. Cl.⁷ .................................. H01L 21/336
(52) U.S. Cl. .................. 438/268; 438/151; 438/156; 438/273
(58) Field of Search ................... 438/138, 151, 438/156, 268, 269, 270, 273

(56) References Cited

U.S. PATENT DOCUMENTS

| | | | |
|---|---|---|---|
| 4,015,278 | 3/1977 | Fukuta | 357/22 |
| 4,055,884 | 11/1977 | Jambotkar | 29/571 |
| 4,072,975 | 2/1978 | Ishitani . | |

(List continued on next page.)

FOREIGN PATENT DOCUMENTS

| | | |
|---|---|---|
| 1 123 119 | 5/1982 | (CA) . |
| 1 136 291 | 11/1982 | (CA) . |
| 0 119 400 | 9/1984 | (EP) . |
| 0 211 972 | 3/1987 | (EP) . |
| 0 237 932 | 9/1987 | (EP) . |
| 0 252 236 | 1/1988 | (EP) . |
| 0 279 403 | 8/1988 | (EP) . |
| 0 304 839 | 3/1989 | (EP) . |
| 0 358 389 | 3/1990 | (EP) . |
| 0 393 949 | 10/1990 | (EP) . |
| 0 405 138 | 1/1991 | (EP) . |
| 0 543 313 | 5/1993 | (EP) . |
| 0 632 503 | 1/1995 | (EP) . |
| 0 671 769 | 9/1995 | (EP) . |
| 0 685 886 | 12/1995 | (EP) . |
| 2 640 081 | 6/1990 | (FR) . |
| 2 087 648 | 5/1982 | (GB) . |
| 51-48981 | 4/1976 | (JP) . |
| 51-85381 | 7/1976 | (JP) . |
| 51-23088 | 9/1977 | (JP) . |

(List continued on next page.)

OTHER PUBLICATIONS

European Search Report from European Patent Application No. 95830468.5, filed Nov. 6, 1995.
European Search Report from European Patent Application No. 95830454.5, filed Oct. 30, 1995.
European Search Report from European Patent Application 95830418.0, filed Oct. 9, 1996.

(List continued on next page.)

*Primary Examiner*—Kevin M. Picardat
(74) *Attorney, Agent, or Firm*—Wolf, Greenfield & Sacks, P.; James H. Morris; Theodore E. Galanthay

(57) ABSTRACT

A MOS-gated power device includes a plurality of elementary functional units, each elementary functional unit including a body region of a first conductivity type formed in a semiconductor material layer of a second conductivity type having a first resistivity value. Under each body region a respective lightly doped region of the second conductivity type is provided having a second resistivity value higher than the first resistivity value.

19 Claims, 8 Drawing Sheets

U.S. PATENT DOCUMENTS

| | | |
|---|---|---|
| 4,145,700 | 3/1979 | Jambotkar ............................ 357/23 |
| 4,344,081 | 8/1982 | Pao et al. ............................. 357/43 |
| 4,345,265 | 8/1982 | Blanchard ............................ 357/23 |
| 4,376,286 | 3/1983 | Lidow . |
| 4,399,449 | 8/1983 | Herman et al. ....................... 357/53 |
| 4,412,242 | 10/1983 | Herman et al. ....................... 357/52 |
| 4,414,560 | 11/1983 | Lidow .................................. 357/39 |
| 4,593,302 | 6/1986 | Lidow . |
| 4,605,948 | 8/1986 | Martinelli ............................. 357/34 |
| 4,642,666 | 2/1987 | Lidow et al. ....................... 357/23.4 |
| 4,680,853 | 7/1987 | Lidow . |
| 4,705,759 | 11/1987 | Lidow et al. ......................... 437/29 |
| 4,716,126 | 12/1987 | Cogan ................................... 437/24 |
| 4,798,810 | 1/1989 | Blanchard et al. ................... 437/29 |
| 4,816,882 | 3/1989 | Blanchard et al. ................ 357/23.4 |
| 4,901,127 | 2/1990 | Chow et al. ....................... 357/23.4 |
| 4,927,772 | 5/1990 | Arthur et al. ........................... 437/6 |
| 4,931,408 | 6/1990 | Hshieh ................................... 437/44 |
| 4,959,699 | 9/1990 | Lidow et al. ....................... 257/328 |
| 4,963,972 | 10/1990 | Shinohe et al. ....................... 357/38 |
| 4,974,059 | 11/1990 | Kinzer ................................ 357/23.4 |
| 5,008,725 | 4/1991 | Lidow . |
| 5,015,593 | 5/1991 | Yawata et al. ......................... 437/25 |
| 5,031,009 | 7/1991 | Fujihira .............................. 357/23.4 |
| 5,043,781 | 8/1991 | Nishiura et al. ................... 357/23.6 |
| 5,119,153 | 6/1992 | Korman et al. ..................... 357/23.4 |
| 5,130,767 | 7/1992 | Lidow et al. ....................... 357/23.4 |
| 5,160,985 | 11/1992 | Akiyama ............................. 257/145 |
| 5,164,804 | 11/1992 | Terashima ........................... 257/487 |
| 5,191,396 | 3/1993 | Lidow et al. ....................... 257/339 |
| 5,208,471 | 5/1993 | Mori et al. .......................... 257/327 |
| 5,286,984 | 2/1994 | Nakagawa et al. ................. 257/139 |
| 5,338,961 | 8/1994 | Lidow et al. ....................... 257/342 |
| 5,382,538 | 1/1995 | Zambrano . |
| 5,397,728 | 3/1995 | Sasaki et al. .......................... 437/44 |
| 5,418,179 | 5/1995 | Hotta ..................................... 437/57 |
| 5,426,320 | 6/1995 | Zambrano ........................... 257/328 |
| 5,442,216 | 8/1995 | Gough ................................. 257/355 |
| 5,489,799 | 2/1996 | Zambrano . |
| 5,508,217 | 4/1996 | Sawada ................................. 437/40 |
| 5,563,436 | 10/1996 | Barret et al. ........................ 257/328 |
| 5,621,234 | 4/1997 | Kato .................................... 257/329 |
| 5,631,483 | 5/1997 | Ferla et al. ........................... 257/341 |
| 5,670,392 | 9/1997 | Ferla et al. ............................ 437/29 |
| 5,731,604 | 3/1998 | Kinzer ................................. 257/153 |
| 5,798,554 | 8/1998 | Grimaldi et al. ................... 257/401 |
| 5,841,167 | 11/1998 | Grimaldi et al. ................... 257/341 |
| 5,981,343 * | 11/1999 | Magri et al. ........................ 438/268 |
| 5,981,998 * | 11/1999 | Frisina et al. ....................... 257/339 |

FOREIGN PATENT DOCUMENTS

| | | |
|---|---|---|
| 52-65943 | 9/1977 | (JP) . |
| 53-66181 | 6/1978 | (JP) . |
| 53-74385 | 7/1978 | (JP) . |
| 53-135284 | 11/1978 | (JP) . |
| WO-A-94 11904 | 5/1994 | (WO) . |

OTHER PUBLICATIONS

European Search Report from European Patent Application 95830055.0, filed Feb. 24, 1995.

European Search Report from European Patent Application 95830535.1, filed Dec. 22, 1995.

European Search Report from European Patent Application No. 95830453.7, filed Oct. 30, 1995.

European Search Report from European Patent Application 95830542.7, filed Dec. 28, 1995.

Mena J., et al., "High Frequency Performance of VDMOS Power Transistors", International Electron Devices Meeting, Technical Digest, Washington, D.C., USA, Dec. 8–10, 1980 New York, NY, USA Patent Abstracts of Japan, vol. 014, No. 387 (E–0967), Aug. 21, 1990 & JP–A–02 143566 (Toshiba Corp.).

Patent Abstracts of Japan vol. 005, No. 040 (E–049), Mar. 17, 1981 & JP–A–55 163877 (Toshiba Corp.).

Patent Abstracts of Japan, vol. 015, No. 442 (E–1131), Nov. 11, 1991 & JP–A–03 185737 (Toshiba Corp.).

Patent Abstracts of Japan, vol. 011, No. 231 (E–527), Jul. 28, 1987 & JP–A–62 047162 (Matsushita Electric Works Ltd.).

Patent Abstracts of Japan, vol. 014, No. 038 (E–878), Jan. 24, 1990 & JP–A–01 272163 (Fuji Electric Co. Ltd.).

Patent Abstracts of Japan, vol. 017, No. 039 (E–1311), Jan. 25, 1993 & JP–A–04 256367 (Hitachi Ltd.).

Patent Abstracts of Japan, vol. 017, No. 213 (E–1356), Apr. 26, 1993 & JP–A–04 349660 (Toshiba Corp.).

Patent Abstracts of Japan, vol. 008, No. 053 (E–231), Mar. 9, 1984 & JP–A–58 206174 (Tokyo Shibaura Denki KK).

Semiconductor Science and Technology, Apr. 1993, UK, vol. 8, No. 4, pp 488–494, Galvagno G., et al. "Diffusion and Outdiffusion of Aluminum Implanted into Silicon".

Stanford Electronics Laboratories, Integrated Circuits Laboratory, Stanford University, Stanford, CA, Technical Report No. 4956–1, Mar. 1976, Michael Donald Pocha, "High Voltage Double Diffused MOS Transistors for Integrated Circuits" pp. 229–240.

IEEE Journal of Solid–State Circuits, vol. SC–11, No. 4, Aug. 1976, Isao Yoshida, et al., "A High Power MOSFET With A Vertical Drain Electrode And A Meshed Gate Structure", pp. 472–477.

Siliconix Technical Proposal in response to N.A.F.I., Solicitation #N00163–77–R–1197, Aug. 31, 1977, Labor And Materials to Design, Develop and Fabricate a 500V/2A N–Channel Metal Oxide Semiconductor F.E.T.

IEEE Transactions On Electron Devices, vol. ED–27, No. 2, Feb. 1980, S.C. Sun. et al., "Modeling Of The On–Resistance Of LDMOS, VDMOS, and VMOS Power Transistors", pp. 356–367.

International Electron Devices Meeting—Tech. Digest, Dec. 8–10, 1980, Washington, D.C., pp. 91–94, J. Mena, et al., "High Frequency Performance Of VDMOS Power Transistors".

Solid State Electronics, vol. 27, No. 5, pp. 419–432, 1984, P. McGregor, et al. "Small–Signal High–Frequency Performance Of Power MOS Transistors".

IEEE Transactions on Electron Devices, vol. ED–31, No. 1, Jan. 1984, pp. 109–113, Jose G. Mena, et al., "Breakdown Voltage Design Considerations in VDMOS Structures".

Solid State Electronics, vol. 29, No. 6, pp. 647–656, 1986, Jose G. Mena, et al., "High–Voltage Multiple–Resistivity Drift–Region I DMOS".

Solid State Electronics, 1977, vol. 29, pp. 875–878, Surinder Krishna, "Second Breakdown in High Voltage MOS Transistors".

Electronic Design, For Engineers and Engineering Managers—Worldwide, pp. 8276–8282, "HEXFET, A New Power Technology Cuts On–Resistance, Boosts Ratings".

ICs and Semiconductors, pp. 8272–8275.

Laid Open Patent Specification No. 85073/80, Laid Open Date: Jun. 26, 1980, Patent No. 75/162,677, Kanushiki Kaisha Hitachi Seisakusho, "Methods For Manufacturing Insulated Gate Type Field Effect Transistors".

* cited by examiner

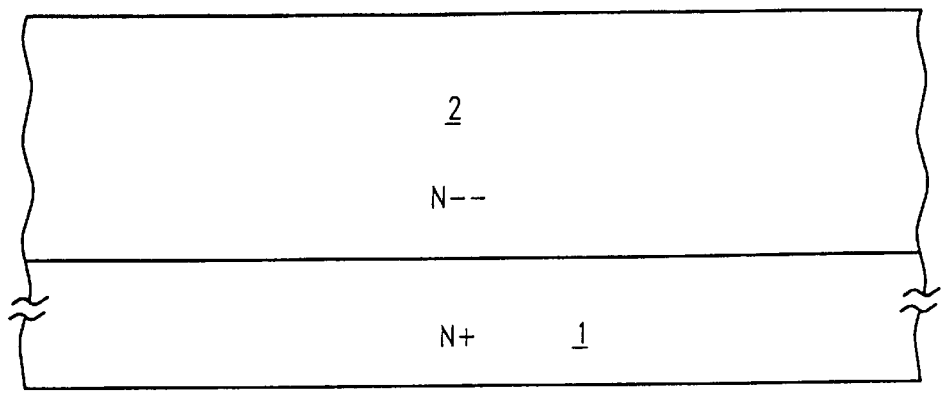
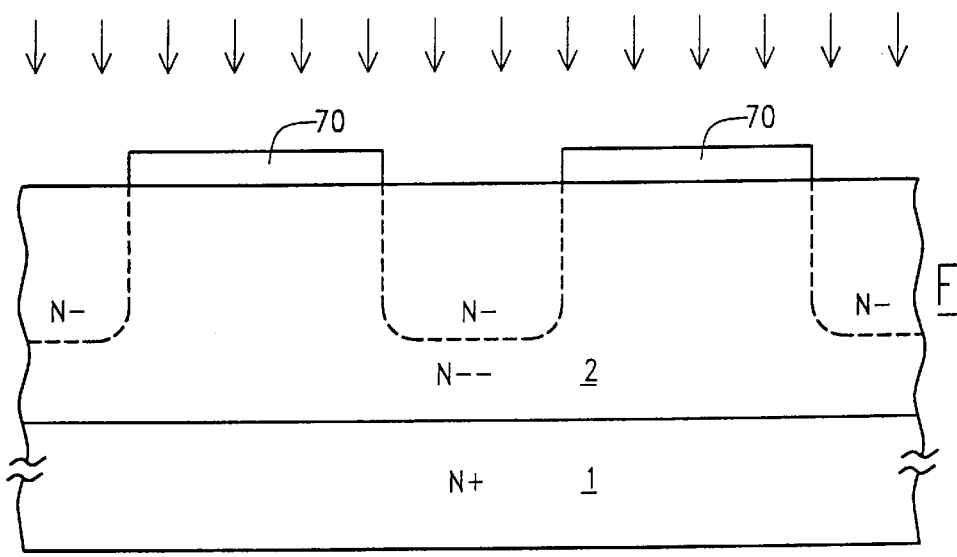
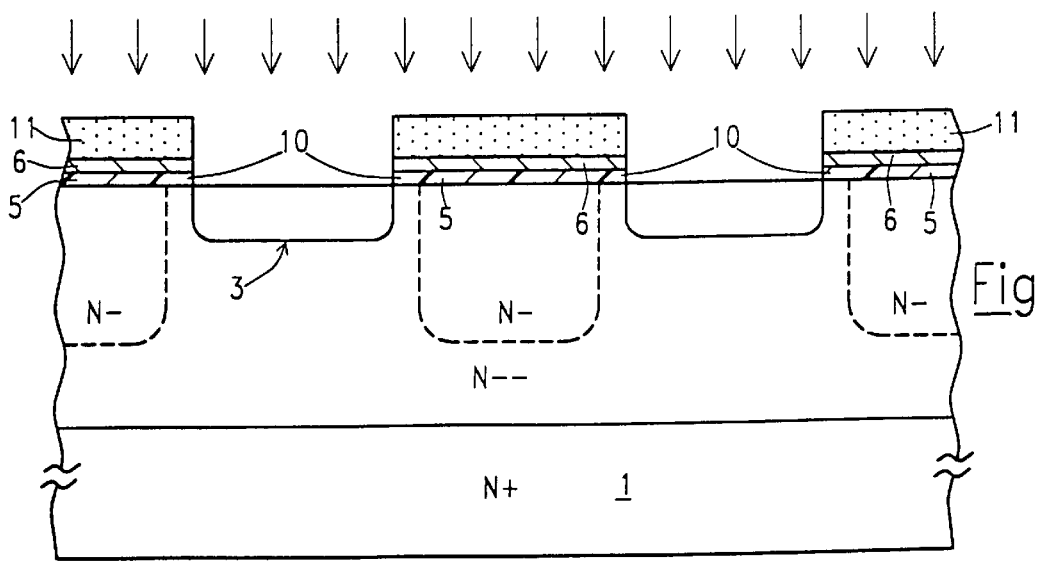

MOS TECHNOLOGY POWER DEVICE WITH LOW OUTPUT RESISTANCE AND LOW CAPACITANCE, AND RELATED MANUFACTURING PROCESS

CROSS REFERENCE TO RELATED APPLICATIONS

This application is a continuation-in-part of application Ser. No. 08/740,713 filed on Nov. 4, 1996, now U.S. Pat. 5,900,662, entitled MOS TECHNOLOGY POWER DEVICE WITH LOW OUTPUT RESISTANCE AND LOW CAPACITANCE, AND RELATED MANUFACTURING PROCESS, which prior application is incorporated herein by reference.

BACKGROUND OF THE INVENTION

1. Field of the Invention

The present invention relates to a MOS-gated power device with low output resistance and low capacitance, and to a related manufacturing process. MOS-gated power devices include, for example, power MOSFETS, IGBTs, MOS-gated thyristors or other MOS-gated power devices.

2. Discussion of the Related Art

A primary goal of the designers of MOS-gated power devices is to reduce, as far as possible, the output resistance (or "on" resistance) and the various capacitances associated with the power device structure.

These parameters can be reduced by increasing the integration density of the elementary functional units (polygonal cells or stripes), which constitute a MOS-gated power device, by exploiting photolitographic techniques and manufacturing processes more and more similar to those used in Very Large Scale of Integration (VLSI) technologies.

However, the physical structure of the MOS-gated power devices limits the degree to which the integration density can be increased. These limits can be better understood considering the distinct components of the on resistance of a MOS-gated power device, which are: the channel resistance Rc, which is the component associated with the channel region of the MOS-gated power device; the accumulation region resistance Racc, which is the component associated with the surface region of those portions of the common drain layer (i.e. the lightly doped epitaxial layer wherein the elementary functional units are formed) disposed between the body regions of the elementary functional units; the JFET resistance Fjfet, which is the component associated with those portions of the common drain layer disposed between the depletion regions of the body regions of the elementary functional units; and the epitaxial layer resistance Repi, which is the component associated with those portions of the common drain layer beneath the body regions of the elementary functional units.

The channel resistance Rc and the accumulation region resistance Racc (both associated with regions near the surface of the common drain layer) can be reduced by scaling down the dimensions of the elementary functional units and by employing photolithographic machines with better optical resolution. Differently, the JFET resistance Rjfet and the epitaxial layer resistance Repi can be reduced only modifying the physical structure of the MOS-gated power devices. In fact, reducing the distance between the elementary functional units (cells or stripes), causes the Fjfet component to significantly increase, the increase being more pronounced the higher the resistivity of the common drain layer.

This means that in order to prevent the on resistance from significantly increasing, the minimum distance to which the elementary functional units of the MOS-gated power device must be kept increases with the increase of the resistivity of the common drain layer. By way of example, in devices designed to operated in a voltage range of approximately 60 V, the distance between the elementary functional units can be between 4 $\mu$m and 10 $\mu$m, while in the case of devices designed to operate in higher voltages of about 500 V, wherein the common drain layer is resistive, the distance between 15 $\mu$m and 20 $\mu$m.

Therefore, if in the attempt to increase the integration density it is desired to reduce the distance between the elementary functional units (cells or stripes), so that the gate-drain (or feedback) capacitance can be reduced, without however increasing the output resistance of the MOS-gated power device, it is necessary to increase the doping concentration of the common drain layer. This however reduces the breakdown voltage of the MOS-gated power device.

One known technique to overcome this drawback is described in the U.S. Pat. No. 4,376,286: the doping concentration in the portions of the common drain layer between the elementary functional units is increased by means of an implant of N type dopants, without affecting the doping concentration of the common drain layer beneath the body regions of the elementary functional units. In this way, it is possible to reduce the distance between the elementary functional units (and consequently reducing the feedback capacitance of the MOS-gated power device), without increasing the Fjfet component of the on resistance.

One of the limitations of this technique is that only the JFET component of the on resistance can be reduced, but not the epitaxial layer resistance Repi. Furthermore, an additional mask may be required in the manufacturing process, to prevent the N type dopants from being implanted at the edge of the power MOS device chip.

In view of the state of the art described, it is an object of the present invention to provide a MOS-gated power device with a low output resistance and low capacitance, without negatively affecting the breakdown voltage.

SUMMARY OF THE INVENTION

According to the present invention, this and other objects are achieved in a MOS-gated power device comprising a plurality of elementary functional units, each elementary functional unit comprising a body region of a first conductivity type formed in a semiconductor material layer of a second conductivity type having a first resistivity value, wherein a respective lightly doped region of a second conductivity type is respectively disposed under each body region, each respective lightly doped region having a second resistivity value higher than said first resistivity value.

As a result of the present invention, and specifically due to the presence of the lightly doped regions under the body regions of the elementary functional units, a MOS-gated power device is provided which, for a given breakdown voltage, has a common drain layer with a lower resistivity than that which would be necessary in a conventional MOS-gated power device with the same breakdown voltage. The reduced resistivity of the common drain layer not only provides a decrease of the JFET component Rjfet, but also of the epitaxial layer component Repi of the output resistance of the MOS-gated power device. Furthermore, it is possible to reduce the distance between the elementary functional units without increasing the JFET component, thus reducing the gate-drain capacitance of the MOS-gated power device.

The structure according to the present invention is particularly suitable for MOS-gated power devices of low voltages (30–200V), in which the dimension of the elementary functional units is comparable with the residual thickness of the epitaxial layer under the body regions.

BRIEF DESCRIPTION OF THE DRAWINGS

These and other features of the present invention will be made more evident by the following detailed description of one particular embodiment, illustrated as a non limiting example in the annexed drawings, wherein:

FIGS. 9 to 11 are cross-sectional views similar to that of FIG. 1 of another embodiment of a manufacturing process according to the invention;

DETAILED DESCRIPTION

Figure 1:
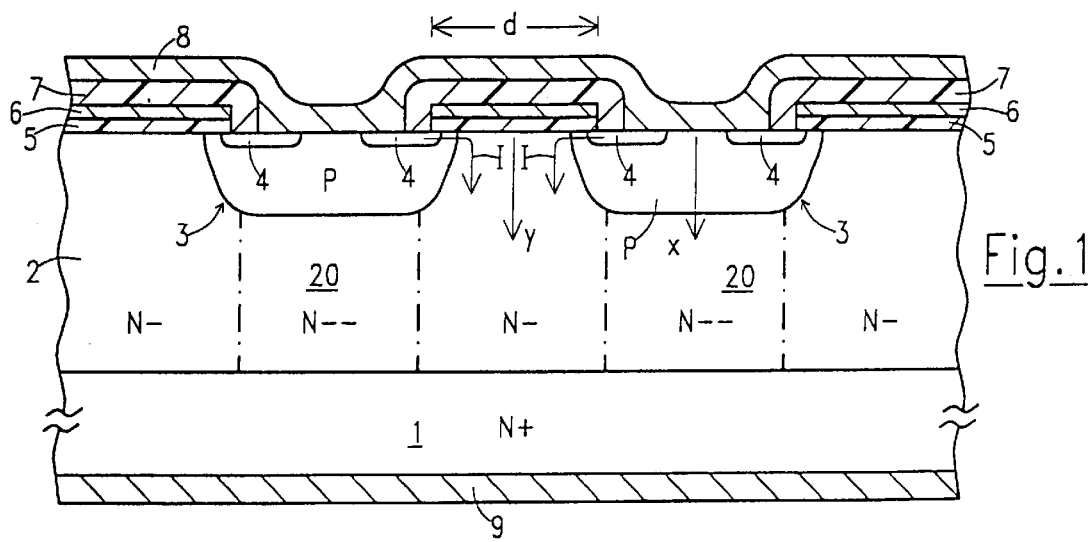
FIG. 1 is a cross-sectional view of a MOS-gated power device according to the present invention.

With reference to the drawings, and specifically to FIG. 1, a MOS-gated power device chip according to the present invention comprises a heavily doped semiconductor substrate 1, over which a lightly doped semiconductor layer 2 is formed, for example by means of an epitaxial growth. In the example shown, referring to the case of an N channel power MOSFET, both the substrate 1 and the epitaxial layer 2 are of the N conductivity type; differently, in a P channel power MOSFET both the substrate 1 and the epitaxial layer 2 would be of the P conductivity type. Also, the substrate 1 and the epitaxial layer 2 could be of opposite conductivity types, as in the case of a Insulated Gate Bipolar Transistor (IGBT).

The epitaxial layer 2 forms a common drain layer for elementary functional units of the MOS-gated power device. Each elementary functional unit comprise a body region 3 of the P conductivity type (or, more generally, of the opposite conductivity type of the epitaxial layer 2). The body regions 3 can have a polygonal layout (e.g. square or hexagonal), as in the case of "cellular" MOS-gated power devices, or alternatively they can be represented by elongated stripes (in which case FIG. 1 shows a cross-section in a direction transverse to the elongated stripes). Inside each body region 3, heavily doped source regions 4 of the N conductivity type (i.e. of the same conductivity type as the epitaxial layer 2) are provided.

The top surface of the epitaxial layer 2 is covered by an insulated gate layer comprising a thin gate oxide layer 5 and a polysilicon layer 6. Openings are provided in the insulated gate layer over each body region 3. The insulated gate layer is covered by an insulating material layer 7 in which contact windows are provided over each body region 3 to allow a source metal layer 8 t contact the source regions 4 and the body regions 3. A drain metal layer 9 is also provided on the bottom surface of the substrate 1. Although region 20 is illustrated as extending through the whole thickness of the epitaxial layer 2, one skilled in the art will appreciate that region 20 may extend only partially through epitaxial layer 2.

In the epitaxial layer 2, beneath each body region 3, a region 20 of the same conductivity type as but having a higher resistivity than the epitaxial layer 2 is provided which extends downwardly substantially for the whole thickness of the epitaxial layer 2, to the substrate 1.

As a result of the presence of the regions 20 beneath the body regions 3, it is possible to reduce the resistivity of the epitaxial layer 2 without decreasing the breakdown voltage of the MOS-gated power device, because the breakdown voltage of the MOS-gated power device depends on the resistivity and on the thickness of the portions of the common drain layer beneath the body regions, not on the portions of the common drain layer between the body regions. In other words, the presence of the lightly doped regions 20 under the body regions 3 allows achievement of the desired breakdown voltage even with an epitaxial layer having a lower resistivity than that necessary with conventional devices.

As a consequence of the decreased resistivity of the epitaxial layer 2, both the JFET component Fjfet and the epitaxial layer component Repi of the output resistance Ron of the MOS-gated power device are reduced, because the current flux I coming from the source regions and flowing towards the substrate 1 encounter a lower resistance.

Also, it is possible to reduce the distance d (FIG. 1) between adjacent elementary functional units without the drawback of an increase of the Rjfet component of the output resistance of the MOS-gated power device.

Figure 6:
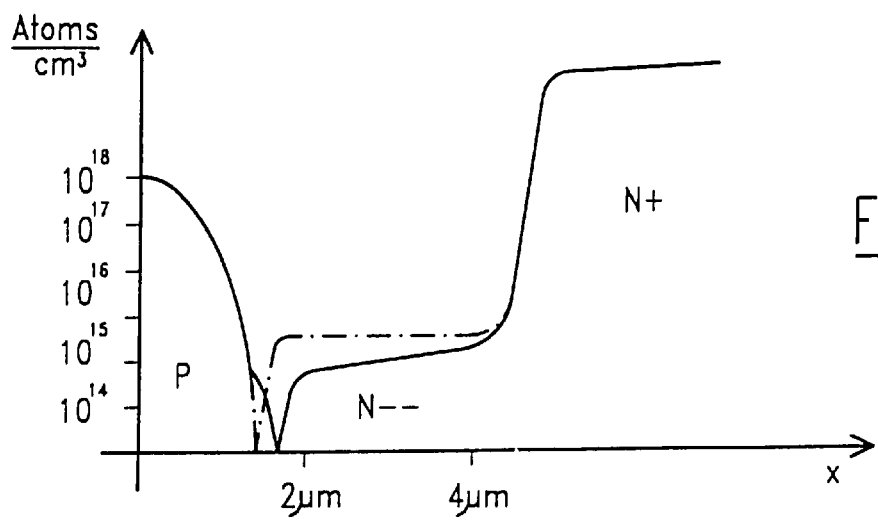
FIG. 6 is a comparative diagram showing doping profiles in the case of a conventional MOS-gated power device and in the case of the present invention.

FIG. 6 illustrates the doping profiles of the different semiconductor regions along the direction of arrow x of FIG. 1 beginning at the surface of body region 3 and moving through the depth of the device towards the substrate. The dash-and-dot line represents the doping profile of a conventional MOS-gated power device structure. The continuous line represents the doping profile of a device in accordance with the present invention.

Figure 7:
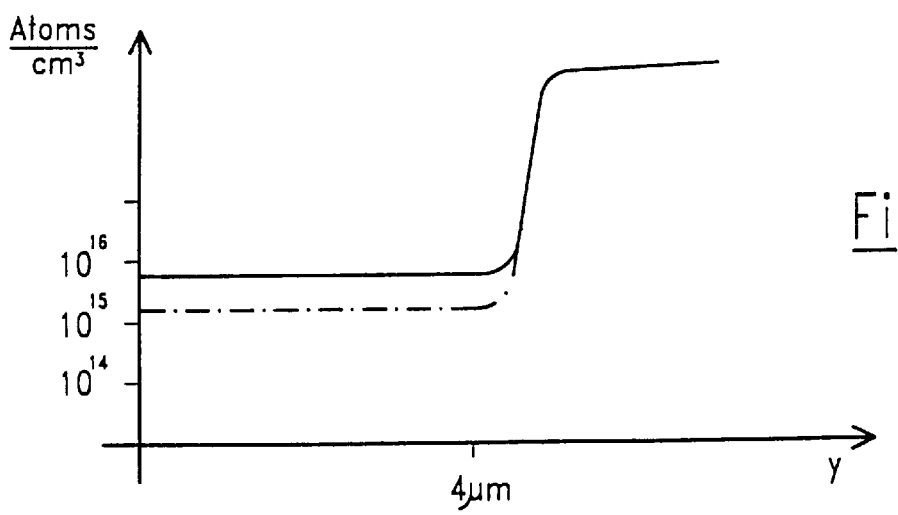
FIG. 7 is another comparative diagram showing doping profiles in the regions between elementary functional units of the MOS-gated power device.

FIG. 7 illustrates the doping profiles of the different semiconductor regions along the direction of arrow Y of FIG. 1 beginning at the surface of the lightly doped semiconductor layer 2 and moving through the depth of the device towards the substrate. The dash-and-dot line represents the doping profile of a conventional MOS-gated power device structure. The continuous line presents the doping profile of a device in accordance with the present invention.

FIGS. 6 and 7 illustrate depth value for low-voltage MOS-gated power devices. For high-voltage MOS-gated power devices, the width of the body region 3 can be, for example, approximately 20 $\mu$m and the depth of regions 20 can therefore be approximately 20 $\mu$m.

Figure 8:
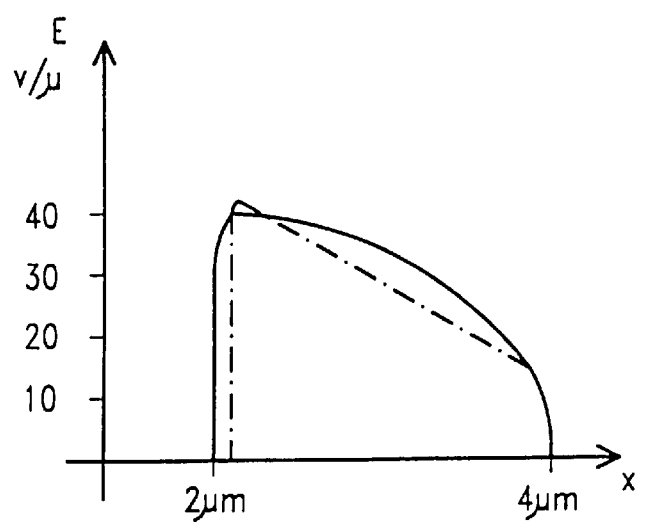
FIG. 8 is a comparative diagram showing the electric field distribution in the case of a conventional MOS-gated power device and in the case of the present invention.

FIG. 8 is a diagram showing the profile of the electric field E in the two cases of FIGS. 6 and 7. From FIG. 8, one skilled in the art will appreciate that in the structure of the present invention the breakdown voltage is higher (the area subtended by the curve of the electric field E is higher in the case of the structure of the present invention (continuous line) than in the case of a conventional structure (dash-and-dot line)).

Figure 2:
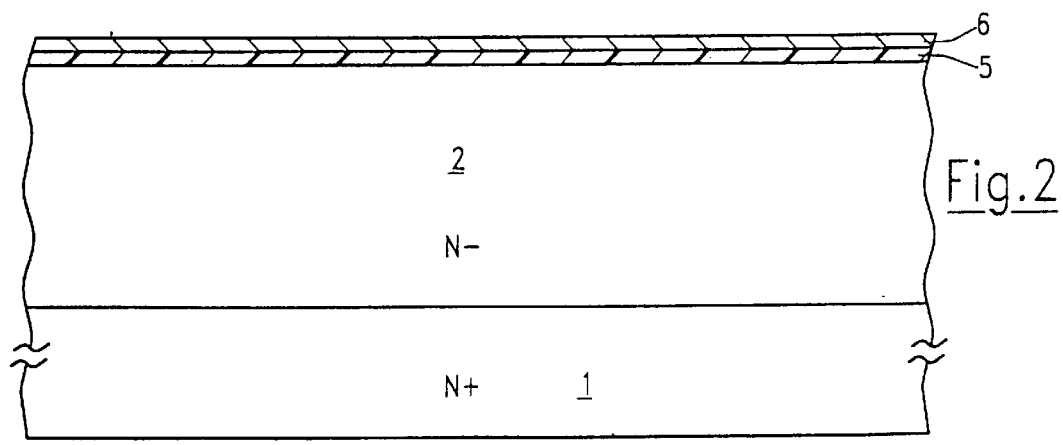
FIGS. 2 to 5 are cross-sectional views similar to FIG. 1 showing intermediate steps of a manufacturing process according to one embodiment of the present invention.

A manufacturing process according to the invention will now be described with reference to FIGS. 2–5A. Referring to FIG. 2, the lightly doped layer 2 is epitaxially grown over the heavily doped substrate 1, the thickness of the epitaxial layer 2 depends on the voltage class of the MOS-gated power device to be fabricated; for example, for low voltage devices the epitaxial layer 2 can have a thickness of about 2 or 5 $\mu$m. However, in conventional devices the resistivity of the epitaxial layer is determined on the basic of the desired breakdown voltage of the MOS-gated power device (for example 1 ohm×cm for a breakdown voltage of 60 V), in the present invention the epitaxial layer 2 has a resistivity which is lower than that necessary to achieve the same desired breakdown voltage (for example 0.6 ohm×cm).

Over the surface of the epitaxial layer 2 a thin oxide layer 5 is formed, for example by means of a thermal growth or, alternatively, a thick field oxide and an active area are formed. A polysilicon layer 6 is then deposited over the oxide layer 5.

Figure 3:
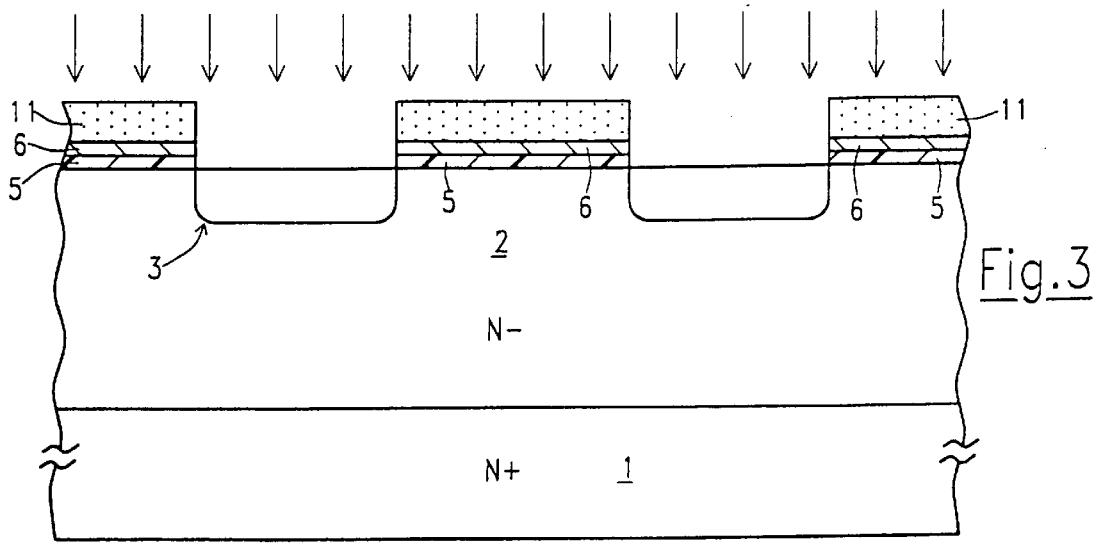

As illustrated in FIG. 3, the polysilicon layer 6 and the oxide layer 5 are then selectively removed from the surface of the epitaxial layer 2 to form openings 10. This step involves depositing a photoresist layer 11, the selectively exposing the photoresist layer 11 to a light source by means of a mask carrying the pattern of the openings 10, selectively removing the photoresist layer 11, and eching the polysilicon and oxide layers 5, 6 where they are not covered by the photoresist layer 11. The openings 10 can have a polygonal layout (for example square or hexagonal, i.e., cellular layout), or they can be elongated stripes.

Figure 4:
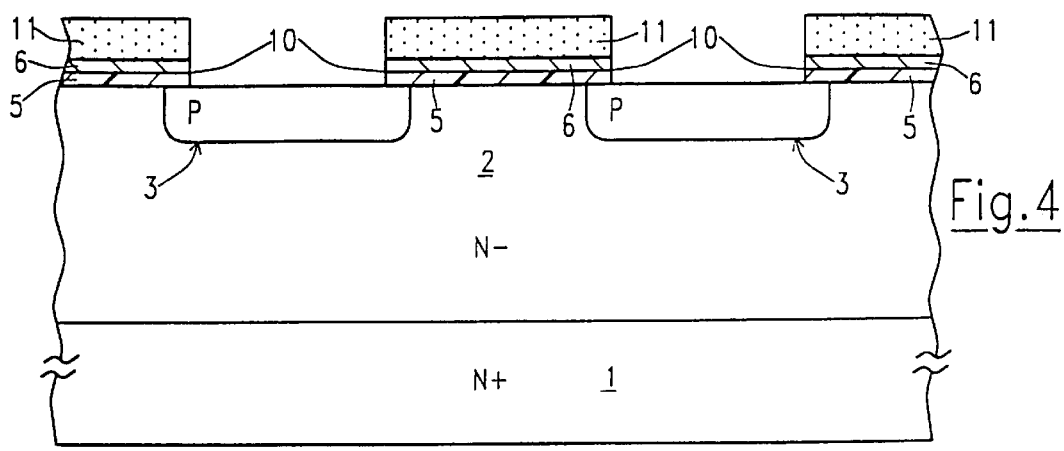

The body regions 3 of the elementary functional units of the MOS-gated power device are then formed. To this purpose, a P type dopant such as boron is implanted, using the polysilicon and oxide layers 5, 6 (and if necessary also the photoresist layer 11) as a mask, in a dose ranging from $5\times10^{13}$ to $5\times10^{14}$ atoms/cm$^2$, with an implantation energy in the range 80–200 KeV (FIG. 3). As illustrated in FIG. 4, a subsequent thermal diffusion of the dopants forms the body regions 3 with a surface concentration in the channel region of approximately $10^{17}$ atoms/cm$^3$, which is a concentration necessary to achieve the desired threshold voltage of the MOS-gated power device.

Alternatively, the body regions 3 can be formed by means of two distinct implants of boron in different doses and at different energies, still using the polysilicon and oxide layers 5, 6 as a mask.

For example, the first implant can involve a dose of a P type dopant in the range $10^{13}$–$10^{14}$ atoms/cm$^2$ with an energy of approximately 80 KeV and is used to control the dopant concentration at the surface of the body regions, especially in the channel regions, which sets the desired threshold voltage of the MOS-gated power device. The second implant can involve, for example, a dose of P type dopant in the range $10^{14}$–$10^{15}$ atoms/cm$^2$ with an energy comprised between 200 KeV and 600 KeV (for low-voltage devices, energies in the range 100 KeV–300 KeV are suitable), such that the peak concentration of the dopants can be located at a prescribed depth, namely under the source regions which will be formed in a later step. A subsequent thermal diffusion process at a temperature in the range 1050–1100° C. for 0.5 to 2 hours determines the lateral diffusion of the dopant introduced with the first implant, to form the channel regions of the body regions extending over the gate oxide layer. The vertical diffusion of the dopant introduced with the second implant does not alter the threshold voltage of the MOS-gated power device, because the dopant ions reach the surface with a concentration lower than the concentration of the dopant introduced with the first implant (in fact, the peak dopant concentration of the dopant introduced with the first implant is located substantially at the surface of the drain layer 2). The vertical and lateral diffusion of the dopants introduced with the second implant forms the heavily doped deep body portions of the body regions, reducing the resistivity of the body regions under the source regions.

Figure 5:
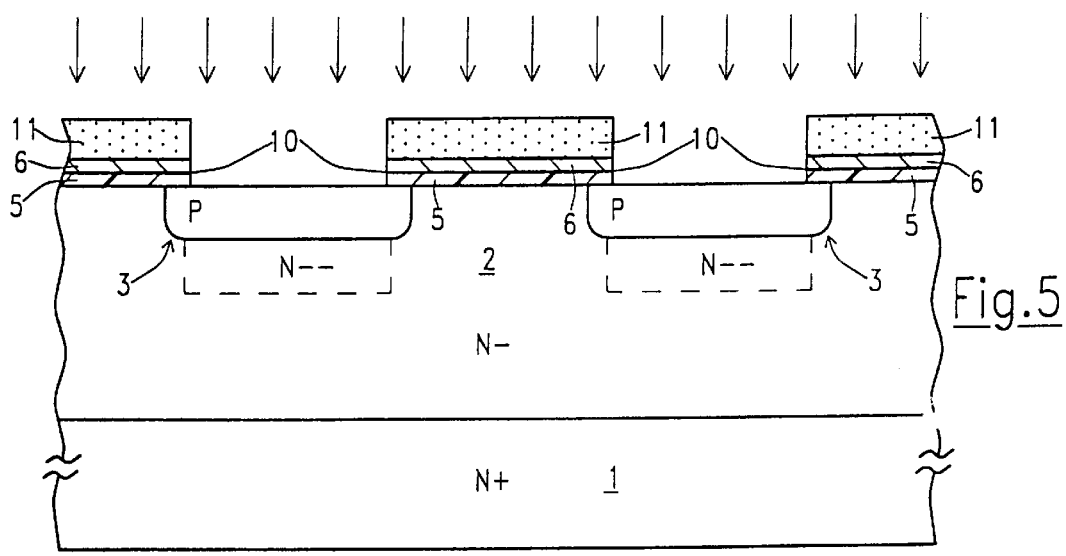

As illustrated in FIG. 5, a dopant of the P conductivity type, preferably one having a high diffusivity such as aluminium, is implanted into the epitaxial layer 2 using the polysilicon and oxide layers 5, 6 (and if necessary the photoresist layer 11) as a mask. The implant dose is suitable to partially compensate, but not to invert, the N type doping level of the epitaxial layer, so as to substantially increase the resistivity of those portions of the epitaxial layer 2 wherein such a dopant is implanted. The implantation energy (ranging from 700 KeV to 1 MeV or more) is such as to locate the peak concentration of the dopant as close as possible to a body-drain junction (1.5–2 $\mu$m from the surface of the epitaxial layer 2).

Figure 5A:
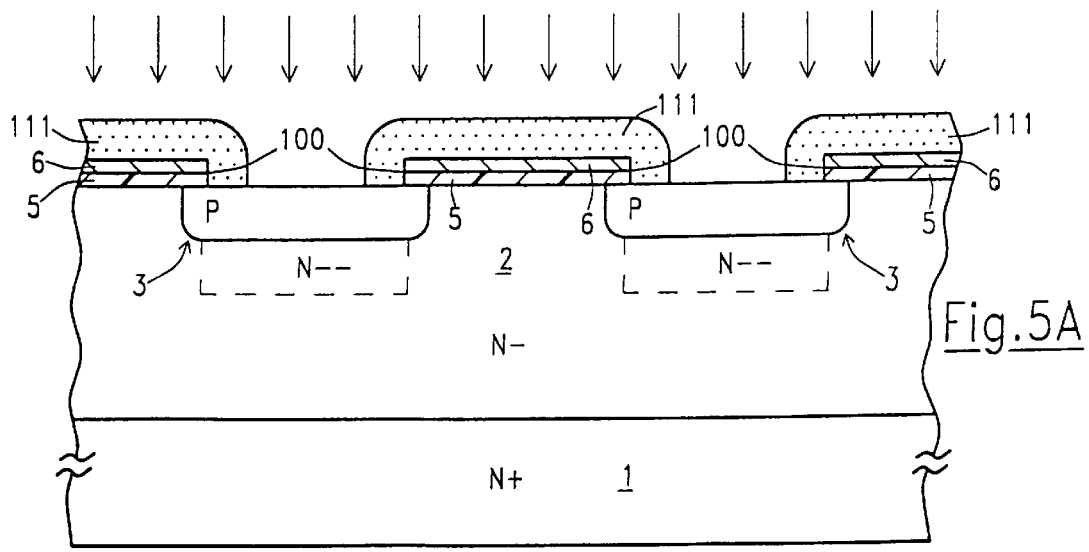
FIG. 5A is a cross-sectional view similar to FIG. 5, illustrating another embodiment of the manufacturing process.

Alternatively, as shown in FIG. 5A, the implant mask for the high-diffusivity dopant could be formed by another photoresist layer 111 with smaller openings 100 than the openings 10 in the polysilicon and oxide layers 5, 6.

Subsequently, a high dose of a N type dopant (such as arsenic or phosphorus) is then selectively implanted into the body regions 3 to form the source regions 4. The N type dopant is then made to diffuse by means of a thermal process. During such thermal process, the source dopant diffuses for a depth of about 0.4–0.5 $\mu$m in the case of arsenic, or about 0.6–0.7 $\mu$m in the case of phosphorus. During the same thermal process, the high-diffusivity dopant diffuses for a depth of about 1.5–2 $\mu$m, distributing in a controlled manner under all the body regions 3 substantially to the substrate 1, modifying the doping profile of the epitaxial layer 2 under the body regions 3 to increase the resistivity of the epitaxial layer 2 in these regions.

The following process steps involve forming a layer of insulating material 7 over the whole surface of the chip, openings contact windows in the insulating layer 7 over the body regions 3, and forming a source metal layer 8 and a drain metal layer 9.

If the budget of the thermal diffusion process used to diffuse the source dopant is not sufficient to completely diffuse the high-voltage devices with a thick epitaxial layer, it is possible to modify the thermal diffusion process of the source dopant, or to invert the described sequence of steps, for example implanting the high-diffusivity dopant before the step of formation of the body regions 3, to exploit the thermal diffusion process of the body regions.

FIGS. 9 to 11 show three steps of another embodiment of the manufacturing process of the invention. In this embodiment, an N--epitaxial layer 2 grown over substrate 1 has a resistivity value suitable for sustaining the desired breakdown voltage, i.e. 2–5 ohm/cm for a device rated for 30–200V.

Then, by means of a mask 70 (FIG. 10), an N type dopant is implanted into the epitaxial layer 2 in regions thereof that will lie between the body regions. The dose and energy of the implanted dopant is chosen so to form N-regions less resistive than the N--layer 2. A suitable dose is for example $10^{12}$–$10^{13}$ atoms/cm$^2$. In this way, N-regions are formed in the N--layer which have a resistivity of 0.5–5 $\Omega$/cm depending on the devices's voltage ratings. Then (FIG. 11), similarly to what is shown in FIG. 3, a p type dopant is implanted to form the body regions 3 between the N-regions.

FIGS. 12 to 18 and 19 to 25 show, in cross-sectional views similar to that of FIG. 1, the main steps of two further alternative embodiments of a manufacturing process according to the present invention. Such embodiments are particularly suitable for manufacturing high-voltage devices, capable of sustaining voltages of 400 to 1000 V or more. A unique aspect of these devices is that, in order to sustain such voltage values, the thickness of the drain layer has to be in the range 30 to 80 $\mu$m or even more. The size of the elementary functional units, be they cells or stripes, varies instead from 5 to 15 $\mu$m.

Clearly, in view of the substantial thickness of the drain layer, the manufacturing processes previously described, providing for a single implantation from the front of the device, could prove not suitable for forming N--regions extending sufficiently in the drain layer under the body regions.

The two embodiments which will be now described overcome the above problem.

Figure 12:
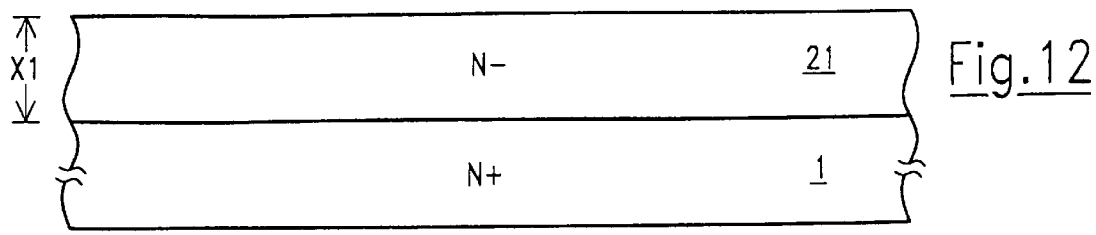
FIGS. 12 to 17 are cross-sectional views similar to that of FIG. 1 of another embodiment of a manufacturing process according to the invention, particularly suitable for the manufacturing of high-voltage MOS-gated power devices.

Referring to FIG. 12, a first lightly doped epitaxial layer 21 of the N conductivity type is formed over the N+substrate 1. Epitaxial layer 21 has a thickness X1 approximately equal to the size of the elementary functional units, be they cells or stripes, i.e., for example, 5 to 15 $\mu$m. The thickness X1 of epitaxial layer 21 is much lower, e.g. one third or less, than the overall thickness of the drain layer of the final device. The doping level of epitaxial layer 21 is higher than that required for assuring that the device keeps the desired high voltage. A doping level of 5–9*$10^{14}$ atoms/cm$^3$ (5–10 ohm/cm) is suitable.

Figure 13:
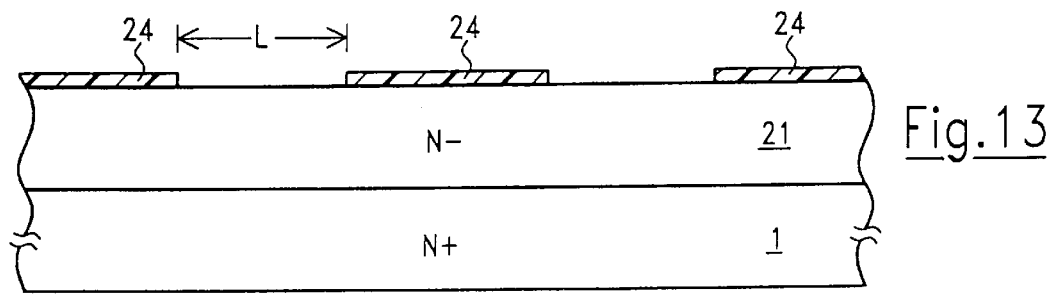

Referring to FIG. 13, an oxide layer 24 is then formed over the top surface of epitaxial layer 21. The oxide layer 24 is then selectively removed from the areas wherein the elementary cells or stripes will be formed. The size L of the openings in the oxide layer 24 is slightly less than the size of the memory cells or stripes. Alternatively, a photoresist layer can be used instead of the oxide layer 24.

Figure 14:
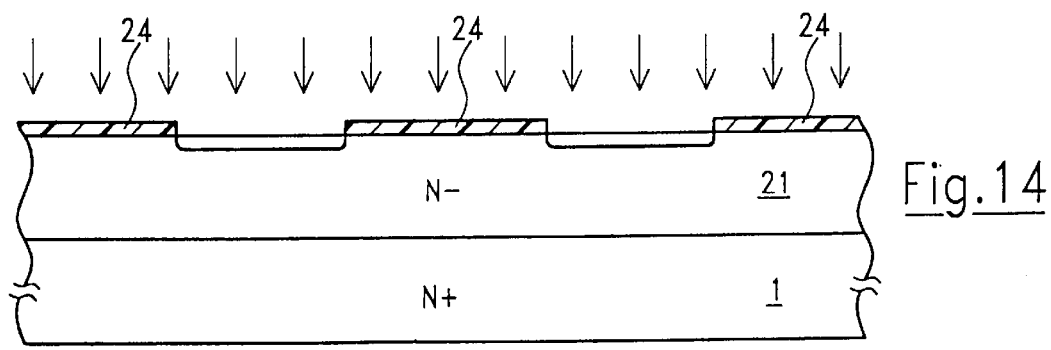

Referring to FIG. 14, a P type dopant such as boron or aluminum is then selectively implanted into the epitaxial layer 21, using the oxide layer 24 as a mask or, alternatively, the photoresist layer. A suitable implantation energy must be higher that 200 KeV, for example in the range 200 to 500 KeV. The implant dose is chosen in such a way that, after the thermal diffusion processes that will follow, the implanted P type dopant partially compensates, but does not invert, the N type doping of the epitaxial layer 21. A suitable dose ranges from 1*$10^{12}$ to 1*$10^{13}$ atoms/cm$^2$.

Figure 15:
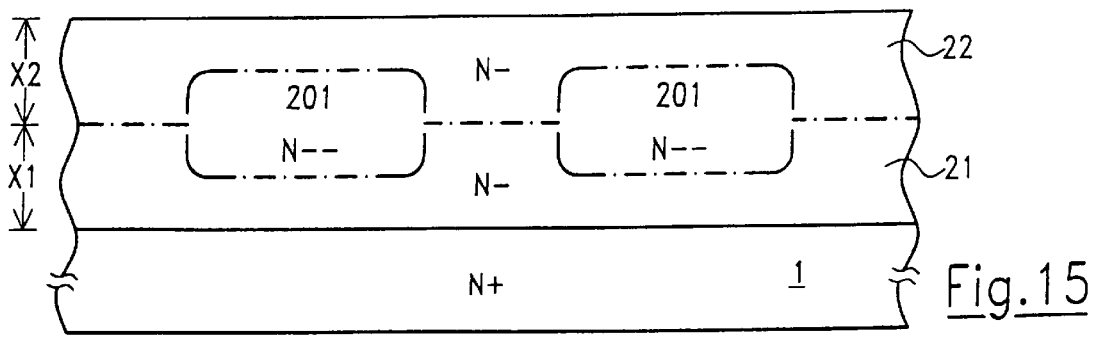

Referring to FIG. 15, the oxide layer 24 is then completely removed and then a second lightly doped epitaxial layer 22 of the N conductivity type is formed over the first epitaxial layer 21. Preferably, the thickness X2 of the second epitaxial layer 22 and its dopant concentration are respectively similar to the thickness X1 and dopant concentration of the first epitaxial layer 21. During the growth of the second epitaxial layer 22, that as known involves a thermal process, the P type dopant previously implanted diffuses into the first and second epitaxial layers 21, 22, thus forming N--regions 201 having dopant concentration approximately lower than or equal to $10^{13}$ atoms/cm$^3$.

Figure 16:
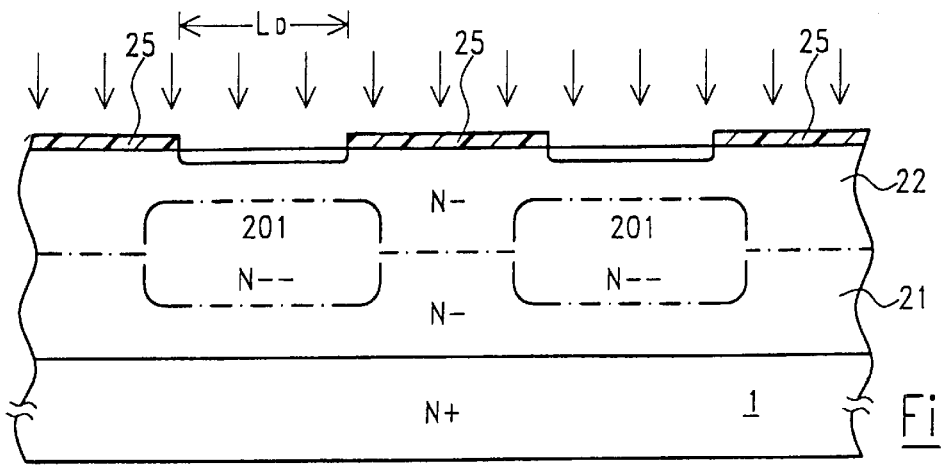

Referring to FIG. 16, another oxide layer 25 is then formed over the second epitaxial layer 22. The oxide layer 25 is then selectively removed using the same photolithographic mask previously used to remove oxide layer 24. A P type dopant such as boron or aluminum is then selectively implanted using the oxide layer 25 as a mask, as in the step depicted in FIG. 11. The implantation dose and energy are chosen in the same way as before.

Figure 17:
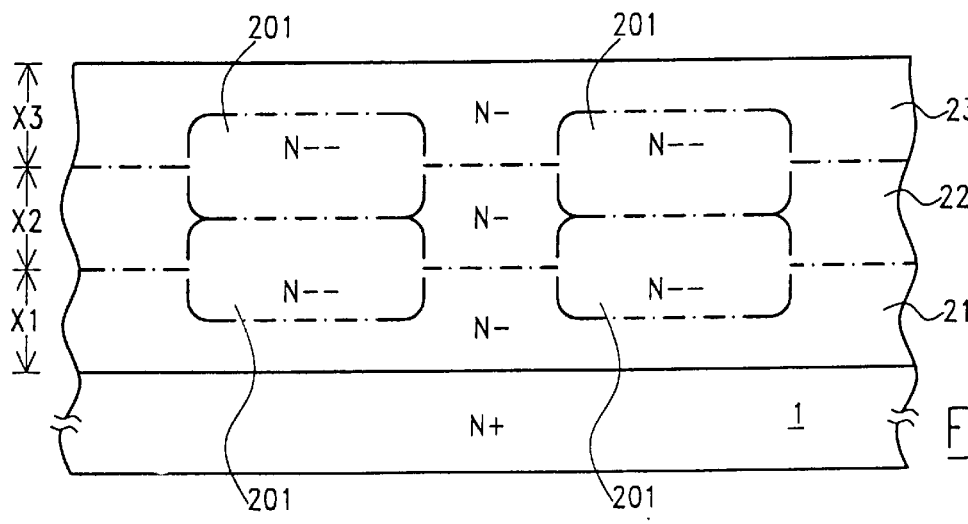

Referring to FIG. 17, the oxide layer 25 is then completely removed, and a third lightly doped epitaxial layer 23 of the N conductivity type is formed over the second epitaxial layer 22. Preferably, the thickness X3 and the dopant concentration of the third epitaxial layer 23 are respectively similar to the thickness X2 and the dopant concentration of the second epitaxial layer 22. During the growth of the third epitaxial layer 23, that involves a thermal process, the P type dopant previously implanted diffuses into the second and third epitaxial layers 22, 23, to form N--regions 202, and also regions 202 further diffuse vertically. In this way, N--regions 202 and N--regions 201 merge, forming columns of stacked N--regions 202, 201. The dopant concentration of N--regions 202 and 201 is suitable to sustain the desired high voltage.

Figure 18:
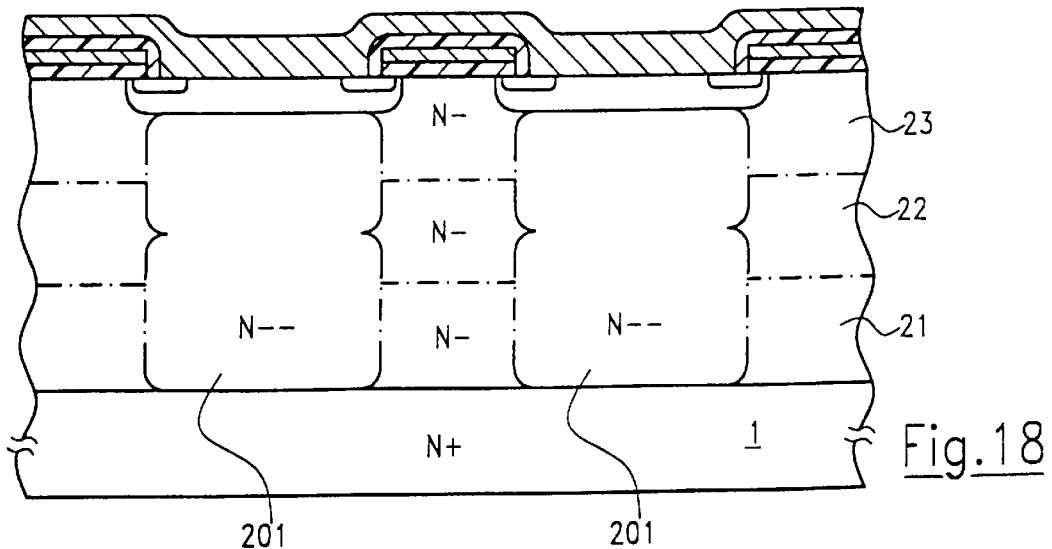
FIG. 18 shows in cross-section the high-voltage MOS-gated power device obtained by the process of FIGS. 12 to 17.

The subsequent steps are similar to those of the processes according to the first two embodiments described. Clearly, the body regions of the elementary functional units will have to be formed in the third epitaxial layer 23 over the stacked N--regions 201 and 202, as shown in FIG. 18.

As an alternative, instead of performing into each of the epitaxial layers 21 and 22 a single implant, several implants can be performed in succession into each of the epitaxial layers 21 and 22. Each implant of the succession is performed with a respective energy, so as to locate the peak dopant concentration at a respective depth. The dose of these implants ranges form 5*$10^{11}$ to 1*$10^{13}$ atoms/cm$^2$, and the energies range from 200 KeV to 900 KeV or more. For example, where the implanted dopant is boran, three implants at 300 KeV, 600 KeV and 900 KeV or more can be performed, so as to have peak dopant concentrations located at a depth of 0.7 $\mu$m, 1.2 $\mu$m and 1.7 $\mu$m, respectively.

In this way, "box" shaped concentration profiles are obtained.

Another manufacturing process particularly suitable for high-voltage devices is depicted in FIGS. 19 to 25.

Figure 19:
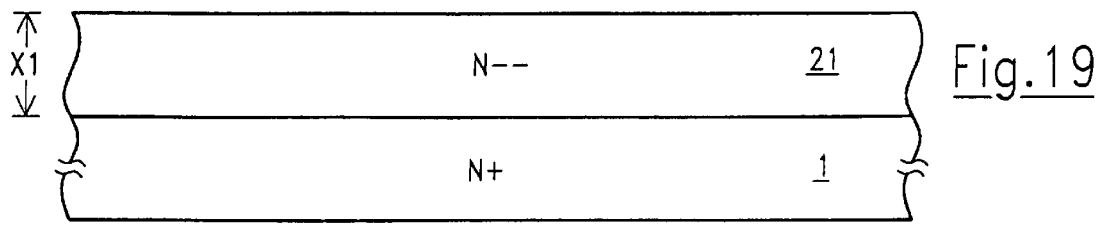
FIGS. 19 to 24 are cross-sectional views similar to that of FIG. 1 of yet another embodiment of a manufacturing process according to the invention, particularly suitable for the manufacturing of high-voltage MOS-gated power devices.

Referring to FIG. 19, as in the last-described process, a first lightly doped epitaxial layer 21 of the N type and thickness X1 is formed over the N+substrate 1. The dopant concentration of the first epitaxial layer 201 is that required for making the final device capable of sustaining the high voltage (that is, by comparison with the process depicted in FIGS. 12 to 18, the dopant concentration of layer 21 is similar to the dopant concentration of N--regions 201 and 202, i.e. 3–5*$10^{13}$ atoms/cm$^3$ (80–150 ohms/cm).

Figure 20:
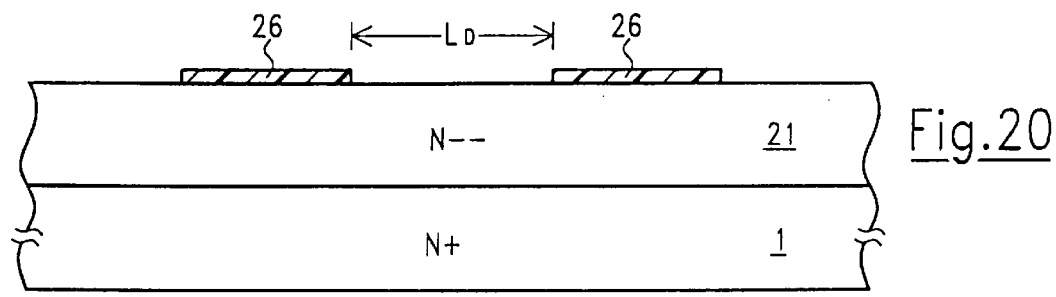

Referring to FIG. 20, an oxide layer 26 is formed over the first epitaxial layer 21. The oxide layer 26 is then selectively removed from the regions of layer 21 which will lie between the body regions of the elementary functional units of the device. The size $L_D$ of the openings in the oxide layer is slightly lower than the distance between the elementary functional units to be formed later on. Alternatively, a photoresist layer can be used instead of the oxide layer 26.

Figure 21:
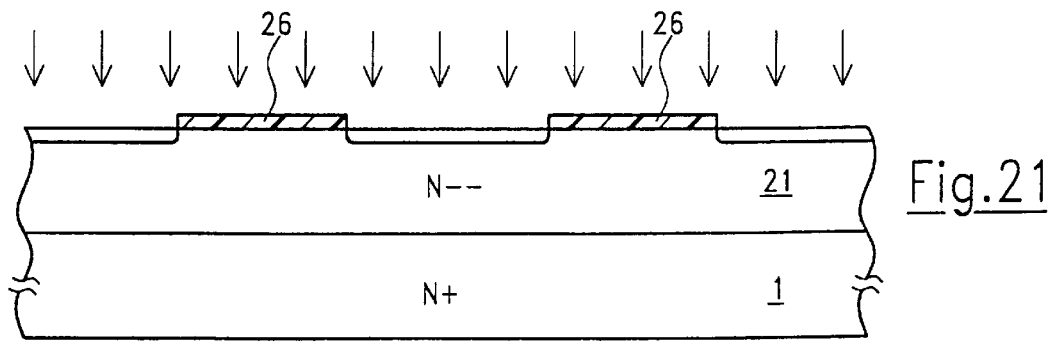

Then, referring to FIG. 21, an N type dopant is implanted into the first epitaxial layer 21 using the oxide layer 26 (or alternatively the photoresist layer) as a mask. Suitable implantation dose and energy are respectively $1*10^{12}-1*10^{13}$ atoms/cm$^2$ and more than 200 KeV (e.g. 200–500 KeV).

Figure 22:
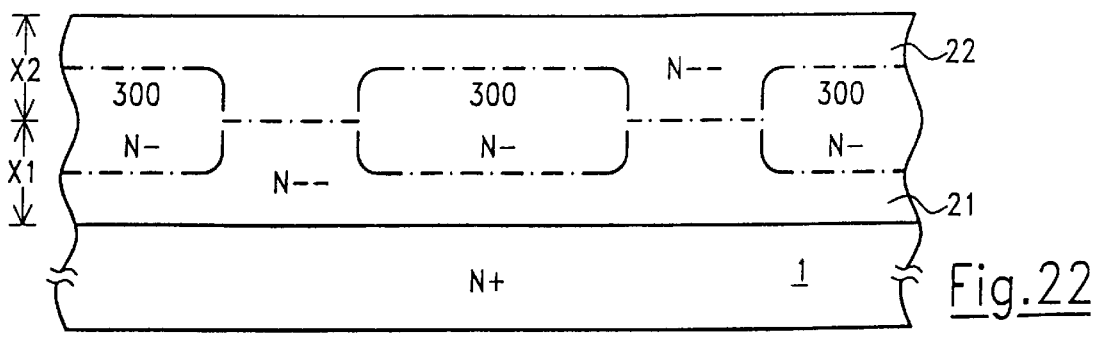

Referring to FIG. 22, the oxide layer 26 is then completely removed, and a second epitaxial layer 22 is formed over the first epitaxial layer 21. Preferably, the thickness X2 and dopant concentration of the second epitaxial layer 22 are respectively similar to the thickness X1 and dopant concentration of the first epitaxial layer 21. During the thermal process involved in the epitaxial growth of the second epitaxial layer 22, the N type dopant previously implanted diffuses into the first epitaxial layer 21 and the second epitaxial layer 22, to form enriched N-regions 300 having a higher dopant concentration than the N--epitaxial layers 21 and 22, for example $5-9*10^{14}$ atoms/cm$^3$ (5–10 ohms/cm).

Figure 23:
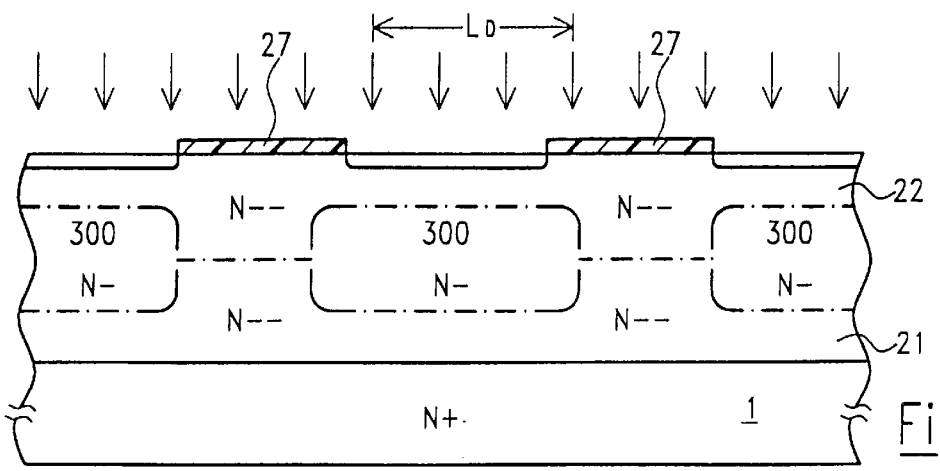

Referring to FIG. 23, another oxide layer 27 is then formed over the second epitaxial layer 22. Oxide layer 27 is then selectively removed by means of the same mask used to selectively removed oxide layer 26. An N type dopant is then selectively implanted into the second epitaxial layer 22 using oxide layer 27 as a mask.

Figure 24:
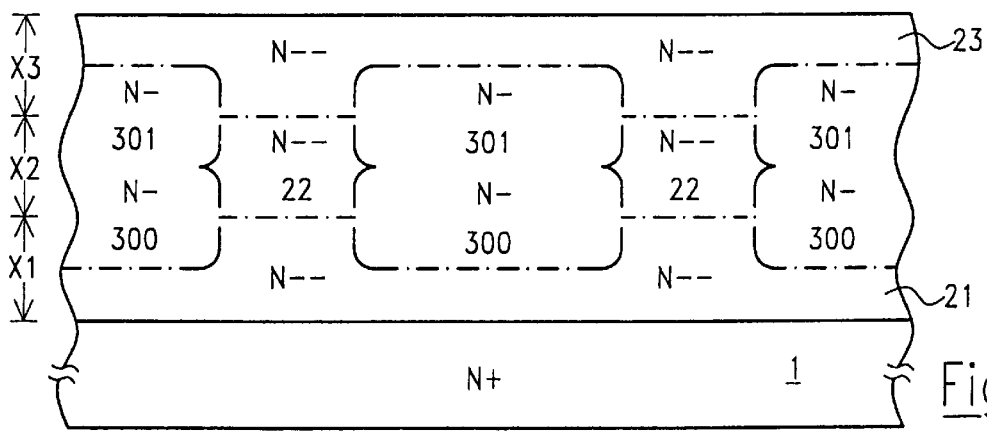

Referring to FIG. 24, the oxide layer 27 is then completely removed, and a third lightly doped epitaxial layer 23 of the N conductivity type is formed over the second epitaxial layer 22. Preferably, the thickness X3 and dopant concentration of the third epitaxial layer 23 are respectively similar to the thickness X2 and dopant concentration of the second epitaxial layer. During the thermal process involved in the epitaxial growth of the third epitaxial layer 23, the implanted N type dopant diffuses into the second and third epitaxial layers 22, 23, to form enriched N-regions 301 over the enriched N-regions 300 previously formed. The latter also diffuse further into the first and second epitaxial layers 21, 22, so that at the end regions 301 merge with regions 300. In this way, stacked enriched N-regions 300, 301 are formed in the first, second and third epitaxial layers 21, 22, 23 in the regions thereof comprised between the elementary functional units which will be formed later on.

Figure 25:
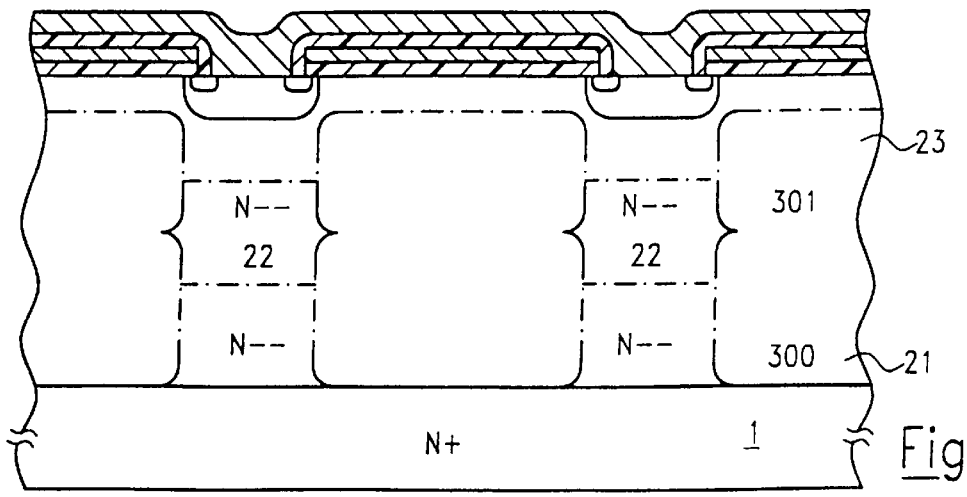
FIG. 25 shows in cross-section the high-voltage MOS-gated power device obtained by the process of FIGS. 19 to 24.

The following steps are completely similar to those of the first two processes described. Clearly, the body regions of the elementary functional units, be they cells or stripes, are to be formed in the third epitaxial layer 23 in the regions thereof between the N-regions 300, 301, as shown in FIG. 25.

Clearly, in both of the two embodiments just described, the number of stacked epitaxial layers can be different from three. The number of epitaxial layers to be formed depends on the overall thickness of the drain layer of the final device, i.e., on the voltage to be sustained by the power device.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for the manufacturing of a MOS-gated power device, comprising the steps of:

a) forming a heavily doped semiconductor substrate;
    b) forming a semiconductor layer of a first conductivity type and with a first resistivity value;
    c) selectively introducing into the semiconductor layer a dopant suitable for forming first regions of the first conductivity type and with a second resistivity value, intercalated by second regions of the first conductivity type with the first resistivity value;
    d) forming on the semiconductor layer a conductive insulated gate layer;
    e) selectively removing the conductive insulated gate layer to open windows over selected portions of a surface of the semiconductor layer, said selected portions of the surface being located over those among the first regions and the second regions which have a higher resistivity value;
    f) forming at said selected portions of the surface of the semiconductor layer body regions of a second conductivity type;
    g) forming in the body regions source regions of the first conductivity type.

2. The process according to claim 1, wherein said dopant is of the first conductivity type, and it is introduced into the semiconductor layer in a dose suitable to make the second resistivity value lower than said first resistivity value, the windows in the insulated gate layer being located over said second region.

3. The process of claim 1, providing for:

a) forming the heavily doped semiconductor substrate;
    b) forming a lightly doped semiconductor layer of a first conductivity type and with a first resistivity value;
    c) selectively introducing into the lightly doped semiconductor layer a dopant suitable for forming first regions of the first conductivity type and with a second resistivity value, intercalated by second regions of the first conductivity type with the first resistivity value;
    d) forming on the lightly doped semiconductor layer a top lightly doped semiconductor layer of the first conductivity type and having substantially the first resistivity value;
    e) forming on the top lightly doped layer a conductive insulated gate layer;
    f) selectively removing the conductive insulated gate layer to open windows over selected portions of a surface of the semiconductor layer, said selected portions of the surface being located over those among the first regions and the second regions which have a higher resistivity value;
    g) forming at said selected portions of the surface of the top lightly doped semiconductor layer body regions of a second conductivity type;
    h) forming in the body regions source regions of the first conductivity type.

4. The process according to claim 3, wherein said dopant is of the first conductivity type, and it is introduced into the lightly doped semiconductor layer in a dose suitable to compensate, but not to invert, a concentration of dopant of the first conductivity type of the lightly doped semiconductor layer, so that said second resistivity value is higher than said first resistivity value, the windows in the insulated gate layer being located over said first regions.

5. The process of claim 4, wherein said lightly doped semiconductor layer has a concentration of dopant of approximately $5-9* 10^{14}$ atoms/cm$^3$, corresponding to a resistivity of 5–10 ohms/cm.

6. The process of claim 5, wherein said top lightly doped semiconductor layer has a concentration of dopant of approximately equal to that of the lightly doped semiconductor layer.

7. The process of claim 6, wherein said dopant is introduced by ion implantation, in a dose of approximately $1*10^{12}$ to $1*10^{13}$ atoms/cm$^2$ and with an energy higher than 100 KeV.

8. The process of claim 3, wherein said dopant is of the first conductivity type, and it is introduced into the lightly doped semiconductor layer in a dose suitable to make the second resistivity value lower than the first resistivity value, the windows in the insulated gate layer being located over said second regions.

9. The process of claim 8, wherein said lightly doped semiconductor layer has a dopant concentration of approximately $3–5*10^{13}$ atoms/cm$^3$, corresponding to a resistivity of 80–150 ohms/cm.

10. The process of claim 9, wherein said top lightly doped semiconductor layer has a dopant concentration of approximately $3–5*10^{13}$ atoms/cm$^3$, corresponding to a resistivity of 80–150 ohms/cm.

11. The process of claim 10, wherein said dopant is introduced by ion implantation, in a dose of $1*10^{12}$ to $1*10^{13}$ atoms/cm$^2$ and with an energy higher than 200 KeV.

12. The process of claim 3, further providing for repeating steps b) and c) at least one time, for forming over the lightly doped semiconductor layer of the first conductivity type and with the first resistivity value at least one intermediate lightly doped layer of the first resistivity type and with the first resistivity value, and for selectively introducing into the at least one intermediate lightly doped semiconductor layer a dopant suitable for forming third regions of the first conductivity type and with the second resistivity value, intercalated by fourth regions of the first conductivity type with the first resistivity value, said third regions and fourth regions being disposed over the first regions and the second regions, respectively.

13. The process of claim 12, wherein the lightly doped semiconductor layer, the intermediate lightly doped semiconductor layer and the top lightly doped semiconductor layer have approximately similar thickness.

14. The process of claim 13, wherein the lightly doped semiconductor layer, the intermediate lightly doped semiconductor layer and the top lightly doped semiconductor layer have similar dopant concentrations of approximately $5–9*10^{14}$ atoms/cm$^3$, corresponding to a resistivity of 5–10 ohms/cm.

15. The process of claim 14, wherein said dopant is of the second conductivity type, and it is introduced into the lightly doped semiconductor layer and the intermediate lightly doped semiconductor layer in a dose suitable to compensate, but not to invert, a concentration of dopant of the first conductivity type of the lightly doped semiconductor layer and the intermediate lightly doped semiconductor layer, so that said second resistivity value is higher than said first resistivity value, the windows in the insulated gate layer being located over said first regions.

16. The process of claim 15, wherein said dopant is introduced into the lightly doped semiconductor layer and into the intermediate lightly doped semiconductor layer by ion implantation, in a dose of approximately $1*10^{12}$ to $1*10^{13}$ atoms/cm$^2$ and with an energy higher than 200 KeV.

17. The process of claim 13 wherein the lightly doped semiconductor layer, the intermediate lightly doped semiconductor layer and the top lightly doped semiconductor layer have similar dopant concentrations of approximately $3–5*10^{13}$ atoms/cm$^3$, corresponding to a resistivity of 80–150 ohms/cm.

18. The process of claim 17, wherein said dopant is of the first conductivity type, and it is introduced into the lightly doped semiconductor layer and into the intermediate lightly doped semiconductor layer in a dose suitable to make the second resistivity value lower than the first resistivity value, the windows in the insulated gate layer being located over said second regions.

19. The process of claim 18, wherein said dopant is introduced into the lightly doped semiconductor layer and into the intermediate semiconductor layer in a dose of approximately $1*10^{12}$ to $1*10^{13}$ atoms/cm$^2$ and with an energy higher than 200.

* * * * *